(12) United States Patent
Cortigiani et al.

(10) Patent No.: US 8,134,388 B2
(45) Date of Patent: Mar. 13, 2012

(54) LOW EMC/EMI EMISSIONS' GATE DRIVER FOR WIDE SUPPLY VOLTAGE RANGES

(75) Inventors: Fabrizio Cortigiani, Padua (IT); Franco Mignoli, Verona (IT); Gianluca Ragonesi, Padua (IT); Silvia Solda, Padua (IT)

(73) Assignee: Infineon Technologies AG, Munich (DE)

( * ) Notice: Subject to any disclaimer, the term of this patent is extended or adjusted under 35 U.S.C. 154(b) by 1579 days.

(21) Appl. No.: 11/505,638

(22) Filed: Aug. 17, 2006

(65) Prior Publication Data

US 2007/0040542 A1    Feb. 22, 2007

(30) Foreign Application Priority Data

Aug. 17, 2005   (EP) .................................. 05 017 890

(51) Int. Cl.
  *H03K 3/00* (2006.01)
(52) U.S. Cl. ........................... 327/108; 327/112; 326/83
(58) Field of Classification Search .......... 327/108–112; 326/82–83, 84
  See application file for complete search history.

(56) References Cited

U.S. PATENT DOCUMENTS

| | | | | |
|---|---|---|---|---|
| 5,371,418 A | * | 12/1994 | Leipold et al. | 327/109 |
| 5,754,074 A | * | 5/1998 | Kelly | 327/434 |
| 5,939,921 A | * | 8/1999 | Strauss et al. | 327/322 |
| 6,313,617 B1 | * | 11/2001 | Engelmann et al. | 323/285 |

FOREIGN PATENT DOCUMENTS

| | | |
|---|---|---|
| DE | 19836577 C1 | 4/2000 |
| DE | 19855604 C1 | 6/2000 |
| DE | 102 40 167 A1 | 3/2004 |
| EP | 0817381 A2 | 1/1998 |
| WO | WO 00/27032 | 5/2000 |

OTHER PUBLICATIONS

BTS 3160D: Smart Low-Side Power Switch HITFET, Target Data Sheet, Nov. 22, 2005, pp. 1-29, vol. 1.8, Infineon Technologies AG.
Consoli, A. et al., "Conducted Emission Improvement of Modem Gate Controlled Devices," *Electromagnetic Compatability*. 1994, Ninth international Conference on Manchester, UK: IEE Conference Publications, Sep. 5-7, 1994. (pp. 191-195).

* cited by examiner

*Primary Examiner* — Kenneth B. Wells
(74) *Attorney, Agent, or Firm* — Maginot, Moore & Beck

(57) ABSTRACT

A method controls a power MOS transistor having a control terminal and a load path, the load path connected in series with a load between voltage supply terminals, wherein a power supply voltage between the voltage supply terminals imposes a load voltage across the load and a load path voltage across the load path of the power MOS transistor. The method includes generating a control current for the control terminal during a switching process when the power MOS transistor changes switching states. The control current is dependent on the power supply voltage and on at least one of the group consisting of the load path voltage and the load voltage.

21 Claims, 10 Drawing Sheets

FIG 1  Stand der Technik   (Prior Art)
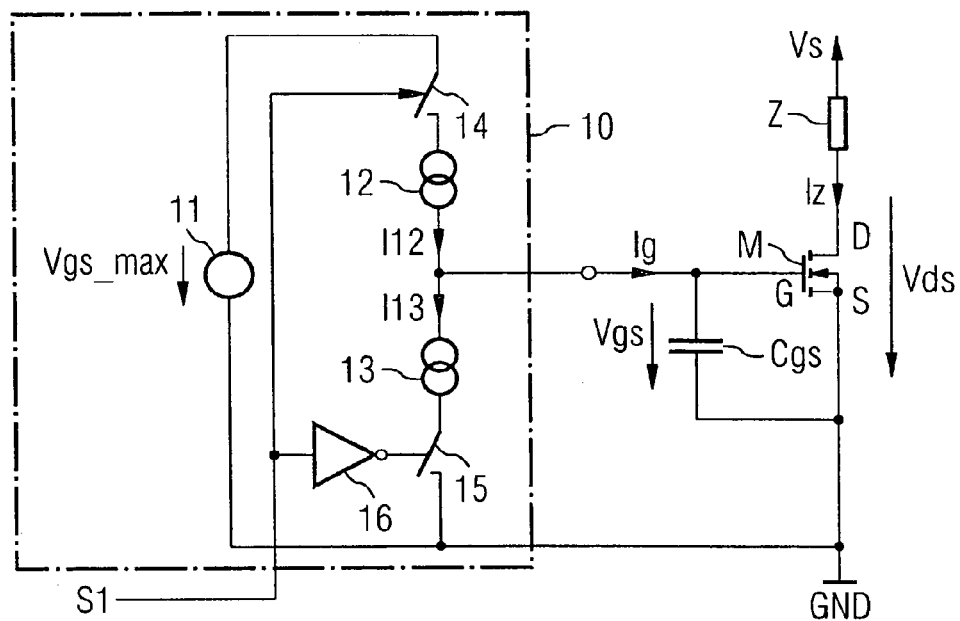
FIG 2  (Prior Art)
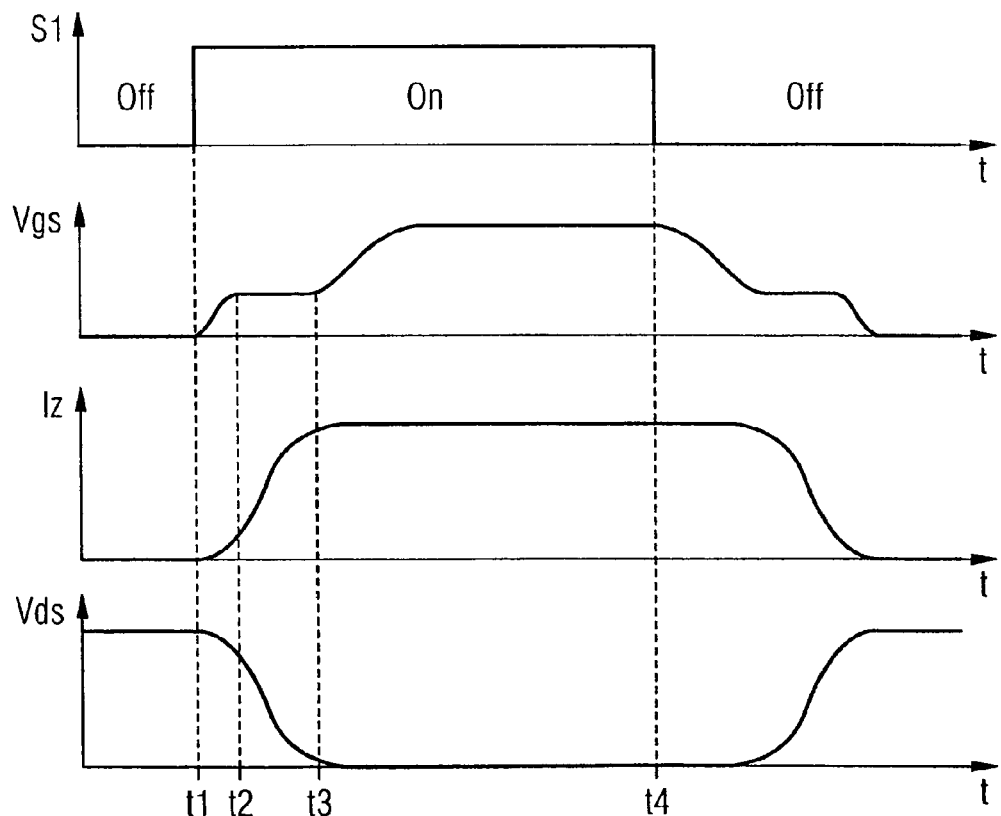

LOW EMC/EMI EMISSIONS' GATE DRIVER FOR WIDE SUPPLY VOLTAGE RANGES

FIELD OF THE INVENTION

The present invention relates to a method and a driver circuit for controlling a power MOS transistor.

BACKGROUND

It is known to employ power MOS transistors, especially power MOSFETs or power IGBTs, as controllable switches for switching of electrical loads.

FIG. 1 shows a circuit arrangement with a power MOS transistor M, configured as a MOSFET, which is employed as a switch, and whose load path(drain-source section) is connected in series with a load Z between terminals for a first and second supply potential Vs, GND. The MOSFET is connected here as a low-side switch, i.e., the load path is connected between the load and the negative power supply potential or reference potential GND.

A fundamental goal in the controlling of a power MOS transistor is to achieve smooth switching slopes, after the MOS transistor is turned on or off, for the current flowing through the load or the voltages imposed across the load and the transistor, so that temporary changes in the load current, and thus an electromagnetic interference radiation, will be reduced.

FIG. 2 illustrates the time curves of the load current IL and the drain-source potential of the MOSFET M for a resistive load Z and with the MOSFET M controlled by a driver circuit 10 as shown in FIG. 1. This driver circuit, responding to a control signal S1, after a switch-on time t1, charges the internal gate-source capacitance Cgs of the MOSFET M, likewise shown in the figure, across a first current source 12 with a constant charging current I12 up to a maximum value Vgs_max, to trigger the MOSFET M into the conducting condition. After a switch-off time t4, the driver circuit 10 discharges the gate-source capacitance Cgs across a second current source 13 with a constant discharge current I13 down to zero, in order to block the MOSFET M.

In this type of driving, the curve of the gate-source potential Vgs between times t2 and t3 after the switch-on time t1 or between times t5, t6 after the switch-off time t4 has regions with very slight gradients, known as "Miller plateaus", being caused by charging effects of the gate-drain capacitance (not shown). The gate-source potential Vgs in the region of the Miller plateau lies in the region of the threshold voltage of the MOSFET.

The time curve of the load current Iz across the MOSFET M and the time curve of the drain-source potential Vds shows that these curves have comparatively steep edges at the beginning and at the end of the Miller plateaus.

To reduce the EMI radiation when switching a power MOSFET, DE 198 55 604 C1 describes how to charge and discharge the gate-source capacitance of the MOSFET during the switching on and off process with different charging and discharging currents, each of them having a constant amplitude.

DE 102 40 167 A1 describes a method whereby the gate charging current for conductive triggering and the gate discharging current for blocking of a MOSFET is increased as the voltage across the load decreases.

WO 00/27032 describes a circuit arrangement for controlling a power MOSFET, which lowers by stages the gate discharging current during the switch-off process with decreasing voltage across a load connected in series with the power transistor (see FIG. 4).

DE 198 36 577 C1 describes a method for controlling a low-side switch, configured as a MOSFET, in a bridge circuit. In this method, a difference between the maximum voltage present across the low-side switch, which corresponds to a power supply voltage, and a voltage which is momentarily present across the low-side switch is determined. Then the ratio of this difference and the power supply voltage is formed, and the gate-source voltage of the MOSFET is adjusted in this method as a function of this ratio.

SUMMARY

The object of the present invention is to provide a method for controlling a power MOS transistor that provides a control process with reduced EMI radiation, and to provide a driver circuit ensuring a controlling of the MOSFET with reduced EMI radiation.

This object is achieved by a method according and by a driver circuit according to embodiments of the invention.

A first embodiment is a method that controls a power MOS transistor having a control terminal and a load path, the load path connected in series with a load between voltage supply terminals, wherein a power supply voltage between the voltage supply terminals imposes a load voltage across the load and a load path voltage across the load path of the power MOS transistor. The method includes generating a control current for the control terminal during a switching process when the power MOS transistor changes switching states. The control current is dependent on the power supply voltage and on at least one of the group consisting of the load path voltage and the load voltage.

The power MOS transistor may suitably be a power IGBT or a power MOSFET.

By using the power supply voltage when generating the control current in the method according to the above-described embodiment, one substantially minimizes the influence of changes in the power supply voltage on the steepness of the switching slopes of the load current, the voltage of the load path, and the load voltage. Such switching slopes are created when the transistor is switched on, i.e., when passing from the blocking to the conducting state, and when it is switched off, i.e., when passing from the conducting to the blocking state.

The control current in the method according to the invention is preferably generated such that it depends during a switching process at least temporarily on a ratio of the load path voltage and the power supply voltage or on a ratio of the load voltage and the power supply voltage.

In one embodiment of the method, a first and a second control current are generated, at least one of which is dependent on the power supply voltage, preferably the ratio of the voltage of the load path or the load voltage and the power supply voltage. One of these first and second control currents is chosen as the control current for the power MOS transistor, and is chosen as a function of the value of the ratio of the load voltage and the power supply voltage, or the value of the ratio of the load path voltage and the power supply voltage. One of these two first and second control currents can be constant, while the other can increase at least for a given interval of the load path voltage with decreasing load path voltage, or it can decrease for a given interval of the load path voltage with decreasing load path voltage.

Furthermore, it is possible for the first control current to increase at least for a first interval of the load path voltage with decreasing load path voltage and for the second control current to decrease at least for a second interval of the load path voltage with decreasing load path voltage. In some embodiments, the first control current will be chosen here if the ratio of the load path voltage and the power supply voltage lies above a first threshold value. The first threshold value, at which switching occurs between the first and second control current, is preferably between 0.4 (40%) and 0.6 (60%), thus, a switching between the first and second control current occurs when the power MOS transistor has been switched on and the voltage of the load path of the MOS transistor has risen to a value that is between 40% and 60% of the power supply voltage. The first interval within which the first control current decreases with decreasing voltage of the load path preferably extends from a second threshold value, which is between 100% and 70% of the power supply voltage, for example, to the first threshold value. The second interval within which the second control current decreases with decreasing voltage of the load path extends preferably from the first threshold value to a third threshold value, where the third threshold value is, for example, between 30% of the power supply voltage and zero.

Additionally, in some embodiments, the first and second control current are chosen such that their values are equal for the first threshold value of the ratio of the load path voltage and the power supply voltage, and the smaller of the first and second control currents will be chosen as the control current for the power MOS transistor.

The above described features and advantages will become more readily apparent to those of ordinary skill in the art by reference to the following detailed description and accompanying drawings.

BRIEF DESCRIPTION OF THE DRAWINGS

FIG. 1 shows a circuit with a power MOS transistor, connected in series with a load, and with a driver circuit of the prior art, which charges the gate of the MOS transistor with a constant charging current according to a control signal, or discharges it with a constant discharging current.

FIG. 2 shows time curves of the control signal, the gate-source voltage, the load current across the MOS transistor, and the voltage of the load path of the MOS transistor for the circuit of FIG. 1.

DETAILED DESCRIPTION

Unless otherwise specified, the same reference symbols in the figures designate the same circuit components and signals with the same meaning.

Figure 3:
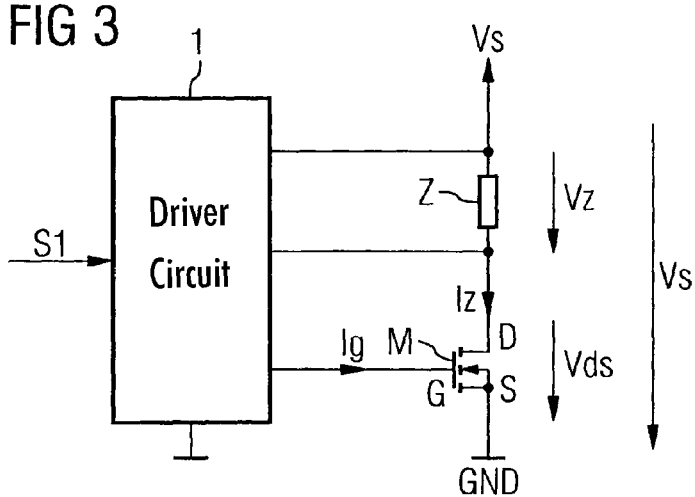
FIG. 3 shows schematically a circuit with a MOS transistor connected in series with a load and a driver circuit which generates a control current for the MOS transistor depending on a power supply voltage, according to the method according to the invention.

To illustrate the method according to the invention, FIG. 3 shows a circuit with a power MOS transistor, configured as a power MOSFET, whose drain-source path, which forms the load path of the MOSFET, is connected in series with a load Z between one terminal for a positive power supply potential Vs and one terminal for a negative power supply potential or reference potential GND. To control the MOSFET M, a driver circuit 1 is present, which provides a control current Ig for the control terminal of the MOSFET M, formed by its gate terminal G, according to a control signal S1.

In order to charge the gate-source capacitance (not shown) of the MOSFET and the MOSFET to the conducting state, the driver circuit 1 furnishes a control current or gate current Ig, which flows in the direction indicated in FIG. 3. In order to discharge the gate-source capacitance of the MOSFET and drive it to the blocking state, the driver circuit 1 furnishes a control current or gate current Ig which flows opposite the direction indicated in FIG. 3.

The driver circuit 1 is configured so as to generate the control current Ig as a function of the power supply voltage imposed across the series circuit with the load Z and the MOSFET. For purposes of illustration, it will be assumed in the present case that the negative power supply potential GND is a reference potential, to which the voltages in the circuit are referred, so that the power supply voltage is equal to the positive power supply potential Vs.

The driver circuit 1, furthermore, is configured to also generate the control current Ig in dependence on the voltage of the load path (drain-source voltage) imposed across the load section, i.e., the drain-source path, of the MOSFET, or in dependence on a load voltage Vz imposed across the load Z. The driver circuit 1 is connected to the terminal for the positive power supply potential Vs, in order to provide the power supply voltage to the driver circuit, and is connected to the common node of the load path of the MOSFET M and the load Z, in order to furnish to the driver circuit 1 the load path voltage Vds of the MOSFET, which is imposed against reference potential at this node, or the load voltage Vz, which is imposed against the power supply potential Vs from this node.

The control current Ig is preferably dependent on the ratio of the load path voltage Vds and the power supply voltage Vs, so that:

$$Ig=f(Vds/Vs) \qquad (1).$$

Since the load voltage Vz corresponds to the difference between the power supply voltage Vs and the load path voltage Vds, and so Vz=Vs−Vds, the dependency of the control current Ig on the ratio of the load path voltage Vds and the power supply voltage Vs is tantamount to a dependency of the control current Ig on the ratio of the load voltage Vz and the power supply voltage Vs, so that:

$$Ig=f(1-Vz/Vs) \qquad (2).$$

f(.) stands here for a function defining the dependency of the control current Ig on the ratio of the load path voltage Vds and the power supply voltage Vs or that of the load voltage Vz and the power supply voltage Vs.

In one embodiment of the method according to the invention, one generates a first control current Ig1 and a second control current Ig2, each of which are dependent on the ratio of the load path voltage Vds and the power supply voltage Vs, and one selects one of these first and second control currents Ig1, Ig2 in dependence on the ratio of the load path voltage Vds and the power supply voltage Vs to be the control current Ig for the MOS transistor M. Then, for example, the control current Ig is:

$$Ig=Ig1=I01+Iref1\cdot(1-Vds/Vs)=I01+Iref1\cdot Vz/Vs \text{ for } Vds/Vs<a \qquad (3a)$$

$$Ig=Ig2=I02+Iref2\cdot Vds/Vs \text{ for } Vds/Vs\leq a \qquad (3b)$$

Ig1 here denotes the first control current, and Ig2 denotes the second control current, a denotes a first threshold value for the ratio of the load path voltage Vds and the power supply voltage Vs at which a switching occurs between the first and second control current Ig1, Ig2. I01 and I02 denote first and second constant current components of the first and second control currents Ig1, Ig2 and Iref1, Iref2 denote reference currents defining the influence of the ratio of the load path voltage Vds and the power supply voltage Vs on the particular control current Ig1, Ig2. For the relation between first and second current component I01, I02 we have preferably:

$$I01\leq I02 \qquad (4).$$

For the relation between the first and second reference currents we have preferably:

$$Iref1>Iref2 \qquad (5).$$

The first and second reference currents are preferably chosen so that they are each proportional, through predetermined proportionality factors, to a nominal value Vs0 of the power supply voltage.

Figure 4:
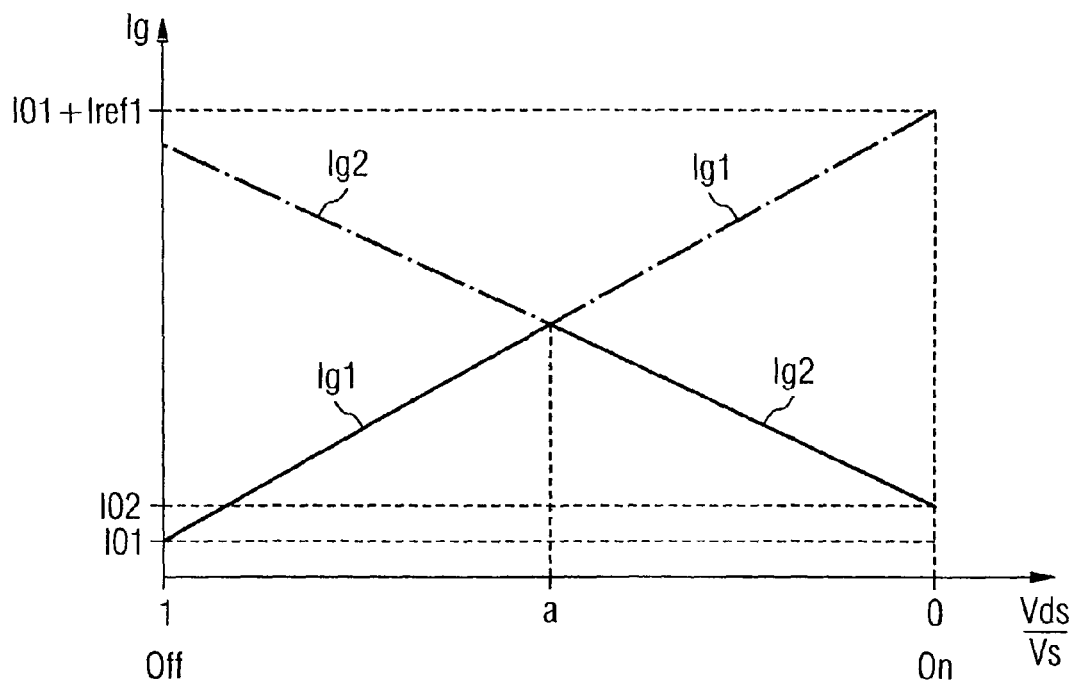
FIG. 4 illustrates the pattern of the control current of the power MOS transistor, depending on a ratio of the voltage of the load path of the MOS transistor and the power supply voltage, for one embodiment of the method according to the invention.

FIG. 4 illustrates the course of the control current Ig, resulting from the first and second control currents Ig1, Ig2, as a function of the ratio of the load path voltage Vds and the power supply voltage Vs. The control current Ig is plotted in FIG. 4 for a decreasing voltage Vds of the load section, i.e., the course of the control current Ig from left to right in FIG. 4 corresponds to the course of the control current Ig during a conductive driving of the MOSFET M, i.e., for a transition of the MOSFET M from the blocked to the conducting state. The MOSFET M is blocking when the load path voltage Vds corresponds to the power supply voltage Vs in the presence of a resistive load Z, i.e., when the ratio of the load path voltage Vds and power supply voltage Vs is 1.

For the conductive driving of the MOSFET, in the exemplary embodiment of the method according to the invention illustrated by FIG. 4, the first control current Ig1 is first used as the control current Ig, rising linearly from the value of the constant current component I01 per equation 3a as a function of the ratio of the load path voltage Vds and the power supply voltage Vs. This first control current Ig charges the gate-source capacitance of the MOSFET M, so that the MOSFET M is increasingly biased into conduction and its load path voltage Vds is decreased. When the ratio of the load path voltage Vds and power supply voltage Vs reaches the first threshold value a, there is a switch from the first control current Ig1 to the second control current Ig2, which further charges the gate-source capacitance and which decreases with decreasing load path voltage Vds of the MOSFET per equation 3b. Idealizing, the representation in FIG. 4 assumes that the switch-on resistance of the MOSFET M for the fully conductive state is approximately zero, so that the ratio of load path voltage Vds and power supply voltage Vs is likewise zero for the fully conductive MOSFET M.

The constant current components I01, I02 of the first and second control current Ig1, Ig2 as well as the first and second reference currents Iref1, Iref2 are preferably attuned to each other so that the first and second control current Ig1, Ig2 are equal for the first threshold value a, and so:

$$Ig1(a)=I01+Iref1\cdot(1-a)=Ig2(a)=I02+Iref2\cdot a \qquad (6).$$

In this case, the control current Ig has a steady trend, i.e., with no abrupt changes. A control current Ig with a pattern according to FIG. 4 can be achieved by generating first and second control currents Ig1, Ig2, each of which has a dependency on the load path voltage Vds and the power supply voltage Vs per equations 3a and 3b, and selecting each time the smaller of the first and second control currents Ig1, Ig2 to be the control current Ig. As shown in FIG. 4, the first control current Ig1 increases beyond the value of the second control current Ig2 for values of the ratio Vds/Vs that are smaller than the first threshold value a. Accordingly, the second control current Ig2 increases beyond the first control current Ig1 for values of the ratio Vds/Vs that are larger than the first threshold value a.

As already explained, the control currents for the conductive and blocking control of the MOSFET have opposite signs. A blocking of the MOSFET M occurs, in regard to FIG. 4, when a control current Ig is furnished whose value is dependent on the ratio Vds/Vs of the curve shown in FIG. 4. When the MOSFET is biased into full conduction, the value of the control current begins to rise, corresponding to the pattern of the curve for the second control current Ig2, until the ratio Vds/Vs has dropped to the first threshold value a. After this, the value of the control current follows the curve for the first control current Ig1.

Figure 5:
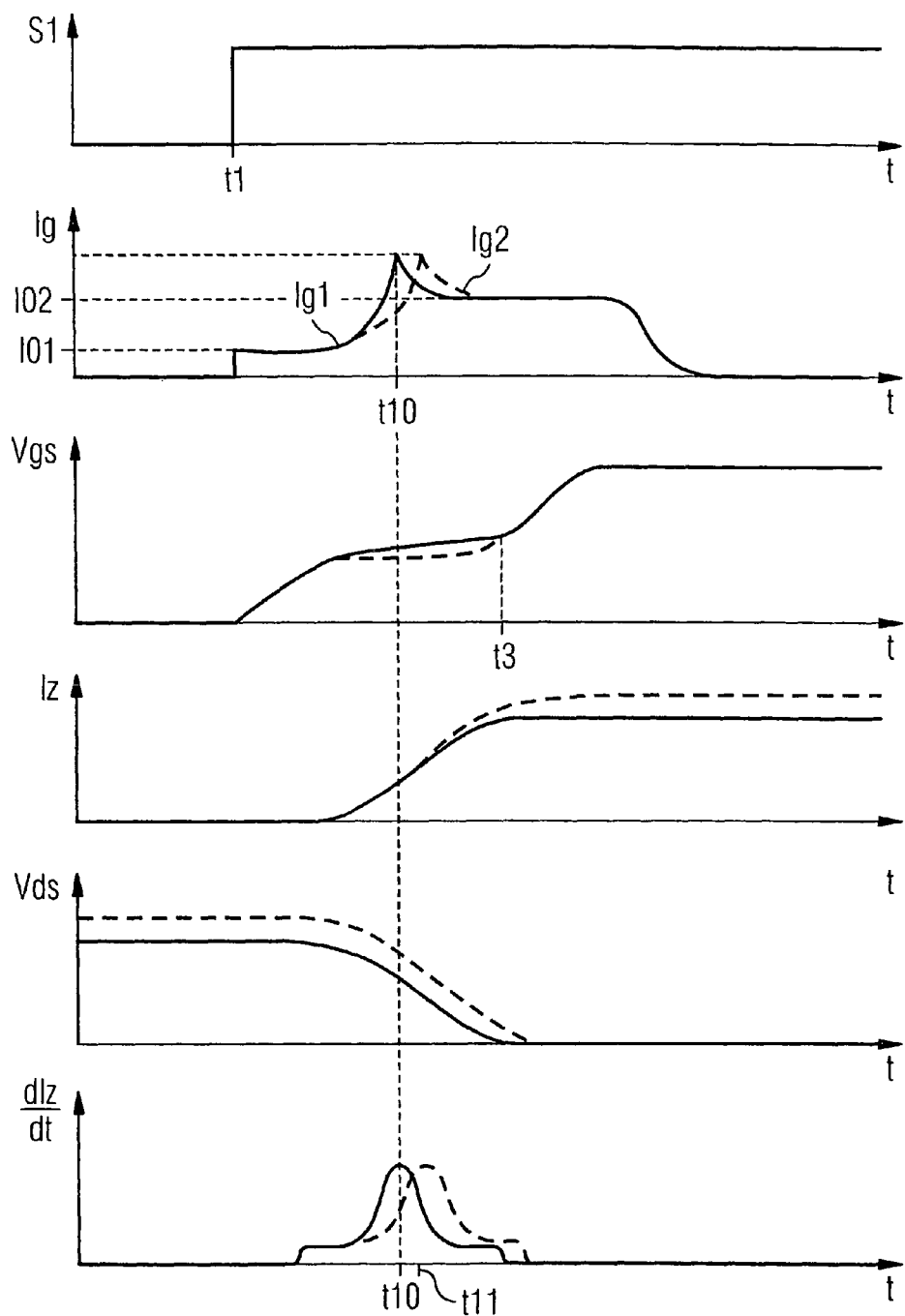
FIG. 5 shows time curves of a control signal, the control current, the gate-source voltage, the load current, the voltage of the load section, and the time variation of the load current for a control current which, according to the curve in FIG. 4, is dependent on the voltage of the load path and the power supply voltage.

FIG. 5 illustrates time curves of the gate current Ig, the gate-source voltage Vgs, the load current Iz, the load path voltage Vds, and the time change in the load current dIz/dt for a control current Ig, which according to the curve in FIG. 4 is dependent on the ratio of the load path voltage Vds and the power supply voltage Vs. FIG. 5 shows the time curves for the switch-on process of the MOSFET.

The switch-on process starts at a first time t1, when the control signal S1 (FIG. 3), which dictates the generating of the control current Ig, takes on a high level. The control current Ig as of this first time t1 begins to charge the gate-source capacitance of the MOSFET M. The MOSFET M is thus biased into conduction, so that its load path voltage Vds drops, which per equation 3a leads in time to a rise in the control current Ig, which corresponds to the first control current Ig1 at the beginning of the switch-on process.

The rise in this first control current Ig1 over time is not linear, since the dependency of the load path voltage Vds on the gate-source voltage of the MOSFET M, which in turn depends on the control current Ig1, is also not linear. After the first time t1, the control current Ig remains at first approximately constant at the value of the first control component I01. During this period, the gate-source capacitance of the MOSFET M is being charged, but the resulting gatesource voltage Vgs still remains below the threshold voltage of the MOSFET, so that the drain-source voltage Vds does not drop at first. The drain-source voltage Vds of the MOSFET only begins to decrease when its gate-source voltage has risen to the value of the threshold voltage. Based on the "Miller effect", the rise in the gate-source voltage Vgs flattens out when the threshold voltage of the MOSFET M is reached, although the control current Ig1 is increasing because of the now decreasing load path voltage Vds per equation 3a. When the ratio of load path voltage Vds and power supply voltage Vs reaches the first threshold value a, there is a switch from the first control current Ig1 to the second control current Ig2, which can be seen by a peak at time t10 on the time plot of the control current Ig. The gate-source capacitance will thus be further charged, until the MOSFET M is biased into full conduction. A fully conductive biasing occurs at roughly time t3, after which the gate-source voltage starting from the Miller plateau rises steeply up to a value of a maximum gate-source voltage. At time t3, the load path voltage Vds of the MOSFET has already dropped to near zero and the load current Iz has already approximately reached its maximum value.

A maximum change in the load current Iz occurs at time t10, with the amplitude of this maximum change being critical to generating electromagnetic interference radiation during the switching process. This time t10 corresponds roughly to the time of the turning point in the time plot of the MOSFET load path voltage Vds. This turning point occurs when the voltage Vds of the load path has dropped to 50% of the value of the power supply voltage. Preferably, the first threshold value at which there is a switch from the first to the second control current Ig1, Ig2 is chosen so that it coincides with the position of this turning point Vds. The first threshold value a is preferably between 0.4 and 0.6 and ideally at 0.5.

The solid lines in FIG. 5 show the time plot of the individual signals for a first value Vs1 of the power supply voltage Vs. Shown by broken lines in FIG. 5 is the time plot of the individual signals for a second value Vs2, which is larger than the first value Vs1. The dependency of the control current Ig on the ratio of the load path voltage Vds and the power supply voltage Vs means that the control current Ig after reaching the Miller plateau for the power supply voltage at first rises less steeply, so that the time plot of the gate-source voltage Vgs is further flattened out in the region of the Miller plateau. As a result, this means that the time for the maximum change in the load current Iz is pushed backward, but the maximum change in the load current Iz and thus the electromagnetic interference radiation occurring during the switch-on process remain the same. The overall length of the switch-on process, i.e., the time until the load current Iz has risen to its maximum value, increases somewhat with increasing power supply voltage Vs in the method according to the invention.

Figure 6:
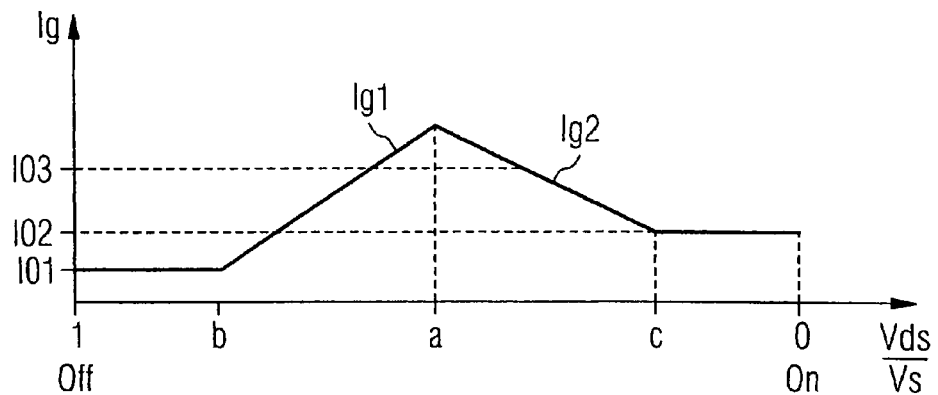
FIG. 6 illustrates the generating of the control current for a second embodiment of the method according to the invention.

FIG. 6 shows the plot of the control current Ig as a function of the ratio Vds/Vs for another exemplary embodiment of the method according to the invention. The first control current Ig1 here takes on the constant value I01 for values of the ratio Vds/Vs greater than a second threshold value b, and the second control current Ig2 takes on a constant current value I02 for values of the ratio Vds/Vs less than a third threshold value c. The second threshold value b of the ratio Vds/Vs is preferably between 0.7 and 1 while the third threshold value c is preferably between 0 and 0.3. Within a first interval between the first and second threshold value a, b, the control current rises continuously with diminishing voltage Vds of the load section, and within a second interval between the first and third threshold value a, c the control current drops continuously with decreasing voltage Vds of the load section. The curve of the control current Ig for values of the ratio Vds/Vs between 0 and 1 is preferably steady. For the first control current Ig1, we have:

$$Ig1 = I01 \text{ for } Vds/Vs \geq b \quad (6a)$$

$$Ig1 = I01 + Iref1 \cdot (1 - Vds/Vs - b \cdot Vds/Vs) \text{ for } Vds/Vs < b \quad (6b)$$

For the second control current Ig2:

$$Ig2 = I02 \text{ for } Vds/Vs < c \quad (7a)$$

$$Ig2 = I02 + Iref2 \cdot Vds/Vs - c \cdot Iref2 \text{ for } Vds/Vs \geq c \quad (7b)$$

An option for the methods described in FIGS. 4 and 6 is to limit the gate current Ig to a maximum value I03 which is smaller than the values og Ig1(a) and Ig2(a). The time plot resulting from such limitation of the gate current is depicted in FIG. 6 in dot and dash lines.

Figure 7:
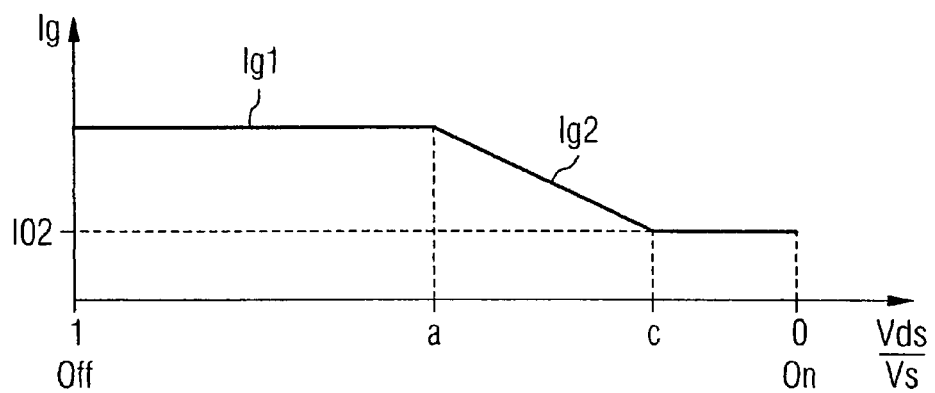
FIG. 7 illustrates the generating of the control current for a third embodiment of the method according to the invention.

FIG. 7 illustrates the plot of the control current Ig as a function of the ratio Vds/Vs for a simplified method in which the first control current Ig1 has a constant value, and in which the second control current Ig2 decreases in segments within the interval between the first and third threshold value a, c of the ratio Vds/Vs with decreasing voltage Vds of the load section. The current value of the first control current Ig1 is chosen such that it corresponds to the current value of the second control current Ig2 for the first threshold value a.

Figure 8:
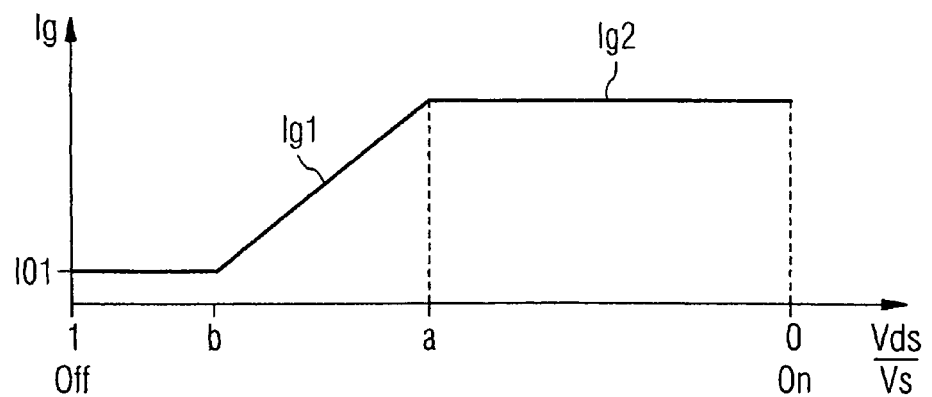
FIG. 8 illustrates the generating of the control current for a fourth embodiment of the method according to the invention.

FIG. 8 illustrates another variant of the method according to the invention, in which the second control current Ig2 is constant and in which the first control current Ig1 increases within the interval between the first and second threshold value a, b with decreasing load path voltage Vds. The value of the second control current Ig2 is chosen so that it corresponds to the value of the first control current Ig1 for the first threshold value a, in order to obtain a steady curve for the control current Ig.

The driving of the MOSFET in the method according to the invention occurs via the control current or gate current Ig of the MOSFET M. The dependency of the control current Ig on the ratio of the load path voltage Vds and the power supply voltage Vs is the same each time for both the switch-on process and for the switch-off process, but the signs of the control currents are different for the switch-on process and the switch-off process.

Preferably the gate current is also dependent on the gate source voltage Vgs in such a way that for small gate source voltages, i.e. gate source voltages much smaller than the threshold value, a constant charging current Ig0, which preferably is higher than Ig1(a) and Ig2(a), is provided. This charging current Ig0 serves for fast pre-charging the gate source capacitance prior to the instance when the MOS transistor starts to change its switching state from non-conducting to conducting, and therefore serves to accelerate the overall switching process. Equivalently a constant discharging current Ig0 is provided for high gate source voltages, i.e. gate source voltages much higher than the threshold voltage. Taking into account such constant pre-charging and pre-discharging currents, the gate current may be expressed as:

| | | |
|---|---|---|
| Ig = ±Ig0 | for Vgs < Vgs0 | (8a) |
| Ig = {Ig1, Ig2} | for Vgs0 ≦ Vgs ≦ Vgs1 | (8b) |
| Ig = ±Ig0 | for Vgs > Vgs1 | (8c) |

Figure 9:
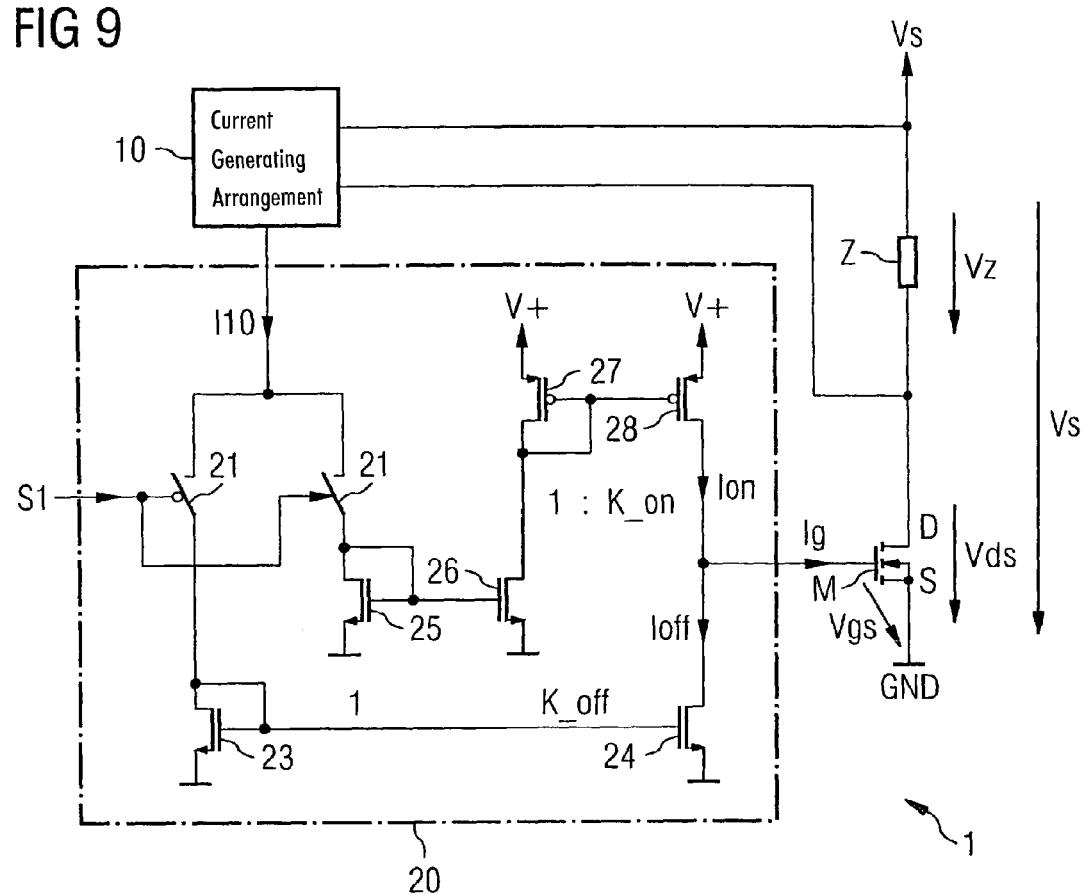
FIG. 9 shows schematically an exemplary embodiment of a driver circuit, having a current generating arrangement and a current mirror arrangement, to furnish a control current according to the method of the invention.

{Ig1, Ig2} stands for the currents Ig1, Ig2 obtained from one of the equations given above. +Ig0 hereby applies for turning on the MOS transistor and −Ig0 applies for turning off the MOS transistor. Vgs0 denotes a voltage level lower than the threshold voltage and Vgs1 denotes a voltage level higher than the threshold voltage. Typical values for power MOS transistors are Vgs0 =1V and Vgs1=4V. A typical value for the pre-charging/discharging current is Ig0=±3 mA. FIG. 9 shows one possible exemplary embodiment for a driver circuit, which optionally furnishes a control current Ig for the MOSFET M in the direction of current flow shown in FIG. 9 or opposite the direction of current flow shown in FIG. 9.

This driver circuit has a current generating arrangement 10, which furnishes an output current I10 that is taken to a current mirror arrangement 20. The current mirror arrangement 20 is configured so as to produce, from this output current I10, a control current Ig for the MOSFET M, which depending on the control signal S1 flows as the "switch-on current" in the direction indicated in FIG. 9 to the gate electrode G of the MOSFET M, or as the "switch-off current" it flows away from the gate electrode G of the MOSFET M opposite the direction indicated in FIG. 9. The current mirror arrangement 20 has a first current mirror 25-28, which can be activated by the control signal S1 and which is configured so as to copy, in the activated state, the output current I10 of the current generating arrangement 10 onto a switch-on current Ion, which flows from one terminal for a power supply potential V+ of the driver circuit to the gate G of the MOSFET M. The current generating arrangement 10 furnishes the output current I10 against the reference potential GND.

The first current mirror 25-28 has a first partial current mirror with an input transistor 25 and an output transistor 26, whose input transistor 25 is connected between the output of the current generating arrangement 10 and reference potential. This input transistor 25 is configured as an n-channel MOSFET and is connected as a diode. A load path of the output transistor 25 of this current mirror 25, 26 is connected in series with the load path of an input transistor 27 of a second partial current mirror between the terminal for the internal power supply potential V+ and reference potential GND. This input transistor 27 of the second partial current mirror is configured as a p-channel MOSFET and likewise connected as a diode. An output transistor 28 of the second partial current mirror is connected between the terminal for the internal power supply potential V+ and the gate terminal G of the MOSFET M and provides the switch-on current Ion. Optionally, it is possible to scale the output current I10 via the current mirror ratio of the second partial current mirror 27, 28, or also via the current mirror ratio of the first partial current mirror 25, 26. For a current mirror ratio of 1:k_on, we have for the switch-on current Ion:

$$Ion = I10 \cdot k\_on \quad (9).$$

The current mirror factor k_on, in particular, can be set equal to one.

The current mirror arrangement 20 has a second current mirror 23, 24 which can be activated by the control signal S1, which in the activated state is configured so as to generate a switch-off current Ioff between the gate terminal G of the MOSFET M and reference potential GND, whose value is proportional to the output current I10 of the current generating arrangement. The second current mirror 23, 24 has an input transistor 23, which is connected as a diode and which in the activated state of the current mirror 23, 24 has the output current I10 flowing through it. One output transistor 24 of this second current mirror is connected between the gate terminal G and reference potential GND. Optionally, it is possible to scale the switch-off current Ioff via the current mirror ratio 1:k_off of the second current mirror 23, 24. For the value of the switch-off current Ioff we have:

$$Ioff = I10 \cdot k\_off \quad (10).$$

The current mirror factor k_off, in particular, can be equal to one.

The two current mirrors 25-28 and 23, 24 of the current mirror arrangement 10 can be activated by switches 21, 22, being triggered in a fashion complementary to each other by the control signal S1. A first switch 21 is connected between the output of the current generating arrangement 10 and the input transistor 25 of the first partial current mirror 25, 26. A second switch 23 is connected between the output of the current generating arrangement 10 and the input transistor 23 of the second current mirror. The first switch 21 is biased into conduction by the control signal S1 when the MOSFET M is supposed to be biased into conduction. In this case, a switch-on current Ion flows from the terminal for the internal power supply potential V+ to the gate G of the MOSFET M. Accordingly, the second switch 22 is biased into conduction when the MOSFET M is supposed to be biased into blocking. In this case, a switch-off current Ioff flows between the gate G of the MOSFET M and reference potential GND.

The internal power supply potential V+ of the driver circuit 1 determines the maximum value of the gate-source voltage Vgs of the MOSFET M in the depicted driver circuit.

The current generating arrangement 10 produces the output current I10 in dependence on the power supply voltage Vs and the load path voltage Vds or load voltage Vz. The time plot of this output current I10 corresponds to the desired time curve for the control current Ig, while the magnitude of the control current Ig may differ from the magnitude of the output current I10 by the current mirror factors k_on, k_off. These current mirror factors k_on, k_off may be different especially in order to scale differently the control current Ig for the conducting biasing or the blocking biasing of the MOSFET M.

The output current I10 of the current generating arrangement 10 can in particular be made dependent, in the manner illustrated by FIGS. 4 and 6 to 8, on the ratio of the load path voltage Vds and the power supply voltage Vs. The curve shown in these figures for the gate current Ig as a function of the ratio Vds/Vs also corresponds to the curve of the output current I10, which can also differ by the scaling factors k_on, k_off from the curves shown in these figures for the gate current Ig.

Figure 10:
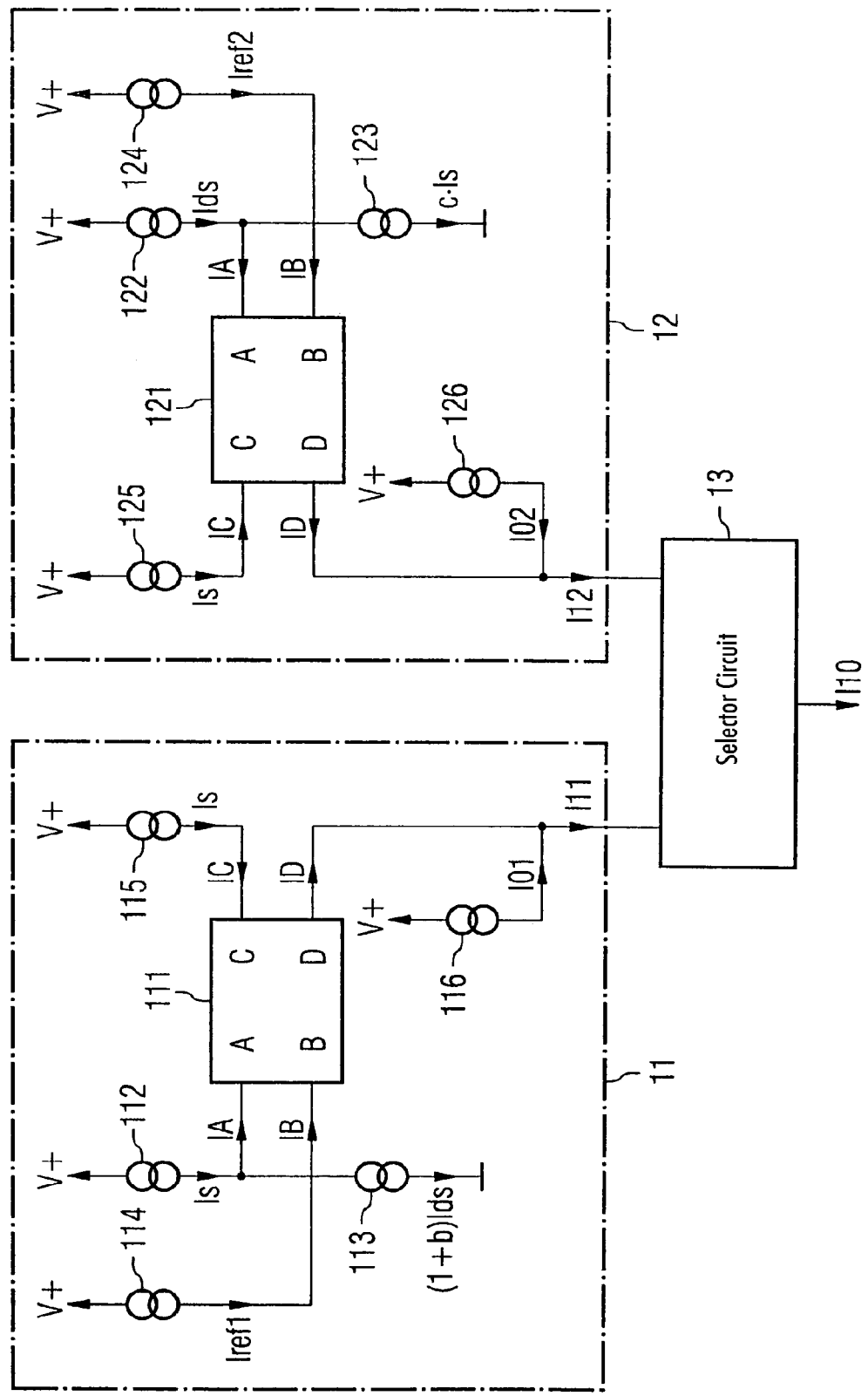
FIG. 10 shows a first exemplary embodiment of the current generating arrangement.

FIG. 10 shows a first exemplary embodiment for the current generating arrangement 10. This driver circuit furnishes an output current I10, which according to the equations 6a and 6b, is dependent on the ratio of the load path voltage Vds and the power supply voltage Vs, if one replaces the control current Ig with the output current I10 in these equations.

This current generating arrangement 10 has a first and a second current source circuit 11, 12, which produce a first and a second output current I11, I12. These output currents I11, I12 are taken to a selector circuit 13, which selects each time the smaller of these two output currents I11 I12 and presents it as the output current I10. The first and second output currents I11, I12 correspond to the first and second control currents Ig1, Ig2 of equations 6a, 6b.

The two current source circuits 11, 12 each have a current multiplier circuit 111, 121, which has four terminals A, B, C, D. The inputs A, B, C of these current multiplier circuits 111, 121 each receive an input current IA, IB, IC. At the fourth terminal D of the current multiplier circuits 111, 121, an output current ID is present. For the ratio of these currents IA-ID of the current multiplier circuits 111, 121 we have:

$$|ID|=IA \cdot IB/IC \text{ for } IA, IB, IC>0 \tag{11}$$

For generating the input currents IA, IB, IC of the current multiplier circuits 111, 121 of the two current source circuits 11, 12, a number of current sources 112-115 and 122-125 are provided. A first input current IA of the first current multiplier 111 is generated by a first current source 112, which produces a current Is proportional to the power supply voltage Vs, and by a second current source 113, which produces a current (1+b)·Ids proportional to the load path voltage Vds. The first current source 112 is connected between a terminal for the internal power supply potential V+ and the first input A and the second current source 113 is connected between the first input A and reference potential GND. A third current source 114 connected to the second input B of the current multiplier 111 furnishes the first reference current Iref1, being the second input current IB of the current multiplier 111. To the third input of the current multiplier 111 is connected a fourth current source 115, which provides a current Is proportional to the power supply voltage Vs as the third input current Ic. For the input currents IA, IB, IC of the first current multiplier 111 in the circuit of FIG. 10 we have:

$$IA=Ids-b \cdot Is \tag{12a}$$

$$IB=Iref1 \tag{12b}$$

$$IC=Is \tag{12c}$$

To the output current ID of the current multiplier there is added a current by a fifth current source 116, corresponding to the first constant current component I01. Taking equation 10 into account, we get for the current I11 present at the output of the first current source circuit 11:

$$I11=I01+Iref1 \cdot (Is-(1+b)Ids)/Is=I01+Iref1 \cdot (1-Ids/Is)-b \cdot Ids/Is \tag{13}$$

Assuming that the current Ids is proportional to the load path voltage Vds and the current Is is proportional to the power supply voltage Vs and that the proportionality factors are each equal, so that Ids/Is=Vds/Vs, the curve of the first output current I11 will correspond to that of the first control current Ig1 per equation 6a.

To the first input A of the second current multiplier 121 are connected a sixth and seventh current source 122, 123. The sixth current source 122 is connected between the terminal for the internal power supply potential V+ and the first input A of the second current multiplier 121 and furnishes a current Is proportional to the load path voltage Vds. The seventh current source 123 is connected between the first input A of the current multiplier 121 and reference potential GND and furnishes a current c·Is proportional to the power supply voltage Vs and the third threshold value c. A second input current Ib of the second current multiplier 121 corresponds to the second reference current Iref2, which is generated by an eighth current source 124. The third input current I10 of the second current multiplier 121 is a current Is proportional to the power supply voltage Vs that is generated by a ninth current source 125.

To the output current Id of the second current multiplier 121 is added another current I02 by a tenth current source 126, corresponding to the constant second current component.

Taking account of equation 10, we have for the second output current I12 of the second current source circuit 12:

$$I12=I02+Iref2 \cdot (Ids-c \cdot Is)/Is=I02+Iref2 \cdot Ids/Is-c \cdot Iref2 \tag{14}$$

The curve of this second output current I12 thus corresponds to the curve of the second control current Ig2 per equation 6b, if the current Is is proportional to the power supply voltage Vs and the current Ids is likewise proportional to the load path voltage Vds.

Figure 11:
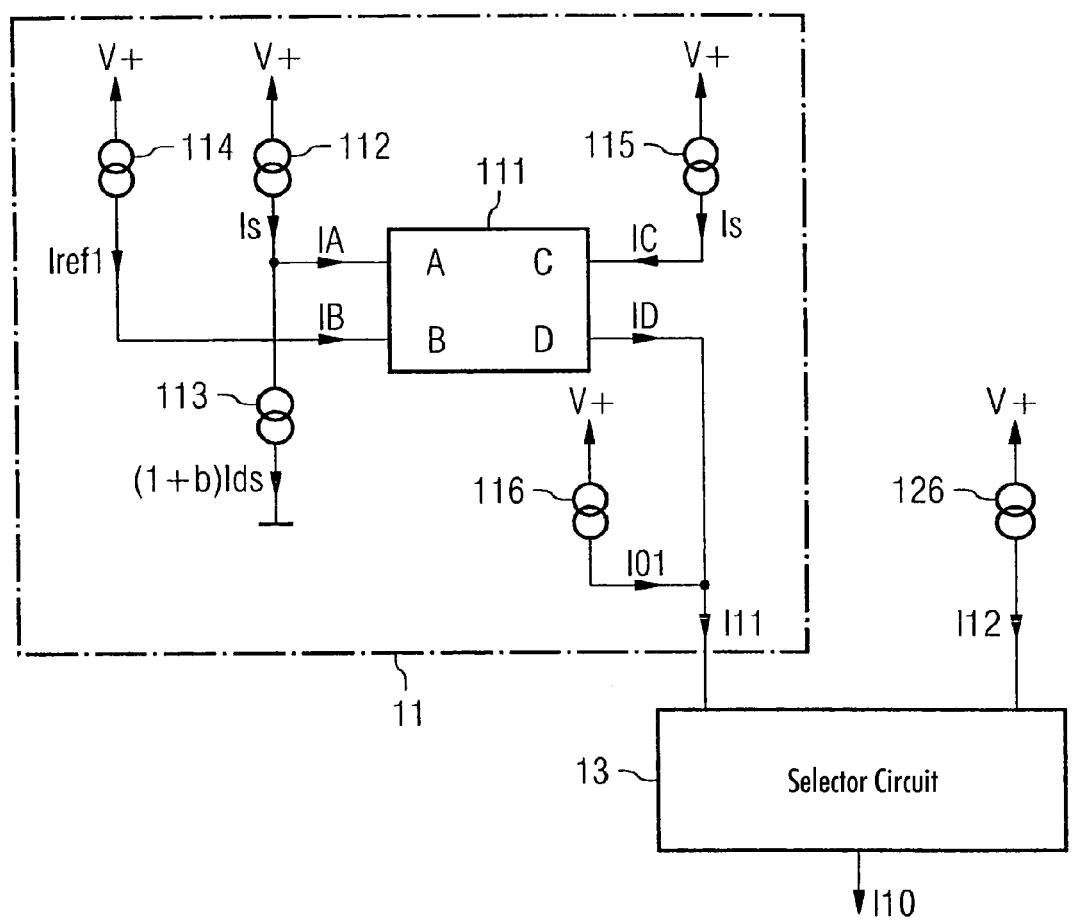
FIG. 11 shows a second exemplary embodiment of the current generating arrangement.

FIG. 11 shows a modification of the current generating arrangement depicted in FIG. 10. The second current I12 that is taken to the selector circuit 13 is here a constant current, which is chosen so that its value corresponds to the value of the first current I11 for Vds/Vs=Ids/Is=a. The output current I10 of the current generating arrangement, corresponding each time to the smaller of the first and second currents I11, I12, then follows the curve of the control current Ig as shown in FIG. 8.

Figure 12:
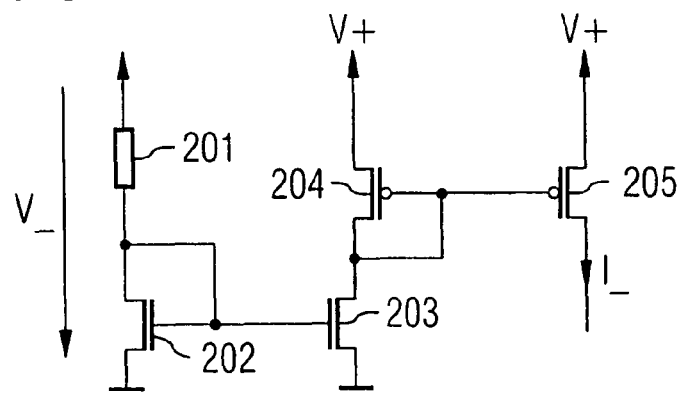
FIG. 12 shows an exemplary embodiment for the current sources present in the current generating arrangements of FIGS. 10 and 11.

The current sources previously illustrated by FIGS. 10 and 11 that produce a current Is or Ids proportional to the power supply voltage Vs or the load path voltage Vds can be realized in simple manner, with reference to FIG. 12, by using a measuring resistor 211 and a current mirror. V_ in FIG. 12 denotes the power supply voltage Vs or the load path voltage Vds, I_ denotes either the current Is proportional to the power supply voltage Vs or the current Ids proportional to the load path voltage Vds.

To generate the current I_proportional to the voltage V_ there is present a measuring resistor 211, which is connected in series with an input transistor 202 of a first current mirror 202, 203. Assuming that the voltage drop across the input transistor 202 is very small in relation to the voltage V_, a current will flow through the measuring resistor 201 that is proportional to the imposed voltage V_. The current flowing against reference potential GND for the input transistor 202 is copied by the output transistor 203 and another current mirror 204, 205, realized by p-channel MOSFET, onto the output current I_ furnished by the current source circuit, which is proportional to the imposed voltage V_.

Figure 13:
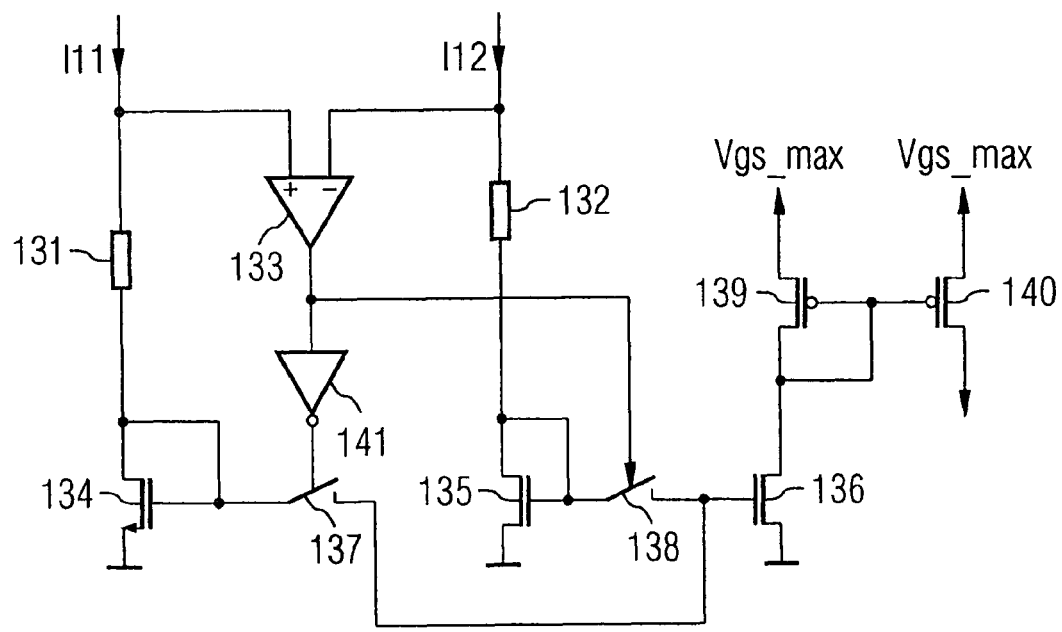
FIG. 13 shows an exemplary embodiment for a selection circuit present in the current generating arrangements of FIGS. 10 and 11.

FIG. 13 shows an exemplary circuitry embodiment for the selector circuit 13, which provides each time the smaller of the two first and second currents I11, I12 as the output current. This selector circuit 13 has two input resistors 131, 132, which are connected in series with the inputs of the selector circuit 13 and through which one of the two currents I11, I12 flows each time. The two resistors 131, 132 are each connected in series to n-channel transistors 134, 135, each of them connected as diodes, which function as input transistors of a current mirror. This current mirror has an output transistor 136, to which is connected one of the two input transistors 134, 135, depending on an output signal of a comparator 133. For the connecting of the input transistors 134, 135 to the output transistor 136, switches 137, 138 are present, being triggered complementary to each other and depending on an output signal of the comparator 133. The comparator 133 compares the voltages across the series circuits of the resistors 131, 132 and the input transistors 134, 135 and connects via the switches 137, 138 that one of the two input transistors 134, 135 through which the smaller current is flowing, to the output transistor 136. For example, if the voltage drop across the first resistor 131 is larger than the voltage drop across the second resistor 132, a high level will be present at the output of the comparator 133, which closes the second switch 138, so as to connect the input transistor 135 through which the second current I12 is flowing to the output transistor 136, forming a current mirror, whereupon a current corresponding to the second current I12 will flow through the output transistor 136 with a current mirror ratio of 1:1. The current flowing through the output transistor 136 is copied by another current mirror 139, 140, realized for example by p-transistors, onto the output current I12. On the other hand, the first switch 137 is closed in order to connect the first input transistor 134 and the output transistor 136 into a current mirror if the voltage drop across the second resistor 132 is greater than the voltage drop across the first resistor 131. It should be noted that the two switches 137, 138 in FIG. 13 are driven complementary using an inverter 141 which is connected between the output of the comparator 133 and the first switch 137 while the second switch is controlled by the comparator output signal directly. The second switch 138 is closed at a high level of the output signal of the comparator 133, while the first switch 137 is opened, and vice versa.

Figure 14:
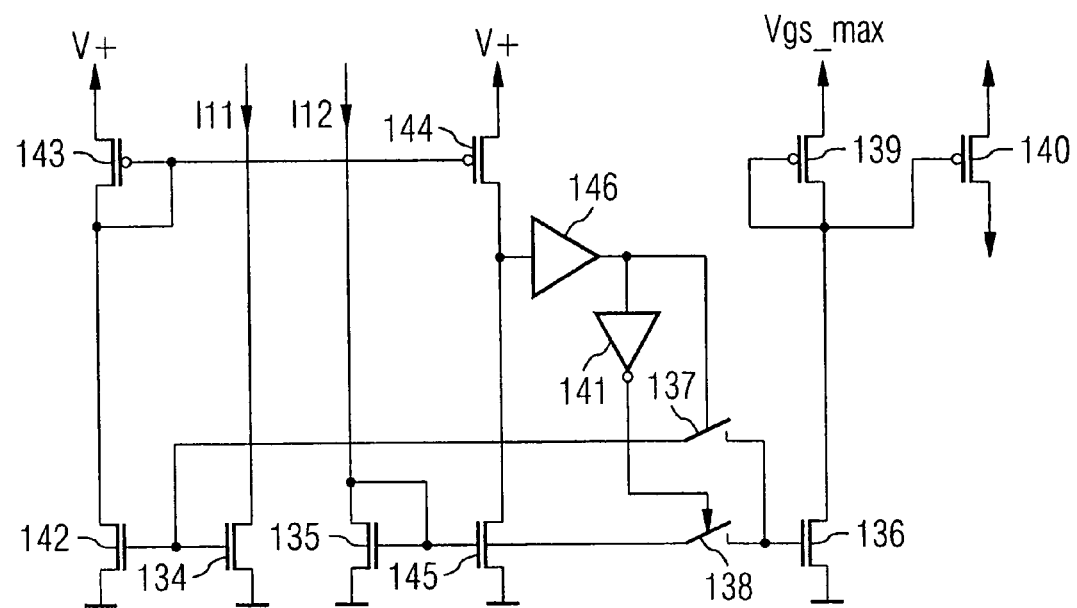
FIG. 14 shows a further embodiment for the selection circuit.

FIG. 14 shows a further embodiment for the selector circuit. The selector circuit comprises a comparator, the output signal of which controls the two switches 137, 138. These switches 137, 138 depending on the comparator signal connect one of the two input transistors 134, 135, each of them being connected as a diode, and the output transistor 136 to form a current mirror. The comparator circuit comprises two current sources 144, 145 being connected in series between the terminals for internal power supply potential V+ and reference potential. The output of the comparator is the node common to the two current sources 144, 145.

The first current source 144 is formed as a p-channel MOSFET, and is the output transistor of a current mirror 134, 142, 144 having the first input transistor 134 of the selector circuit as an input transistor. The first current source 144 therefore provides a current being proportional to the first input current I11. The second current source 145 is formed as a n-channel MOSFET, and is the output transistor of a current mirror 135, 145 having the second input transistor 135 of the selector circuit as an input transistor. The second current source 145 therefore provides a current being proportional to the second input current I12.

The comparator output takes on a high level if the first input current I11 is larger than the second input current I12. Via buffer 146 connected to the output of the controller the first switch 137 is closed, thereby connecting the first input transistor 134 and the output transistor 136 to form a current mirror. The output current of the selector circuit is then proportional to the first input current I11.

The comparator output takes on a low level if the second input current I12 is larger than the first input current I11. Via buffer 146 and inverter 141 the second switch 138 is closed, thereby connecting the second input transistor 135 and the output transistor 136 to form a current mirror. The output current of the selector circuit is then proportional to the second input current I12.

Figure 15:
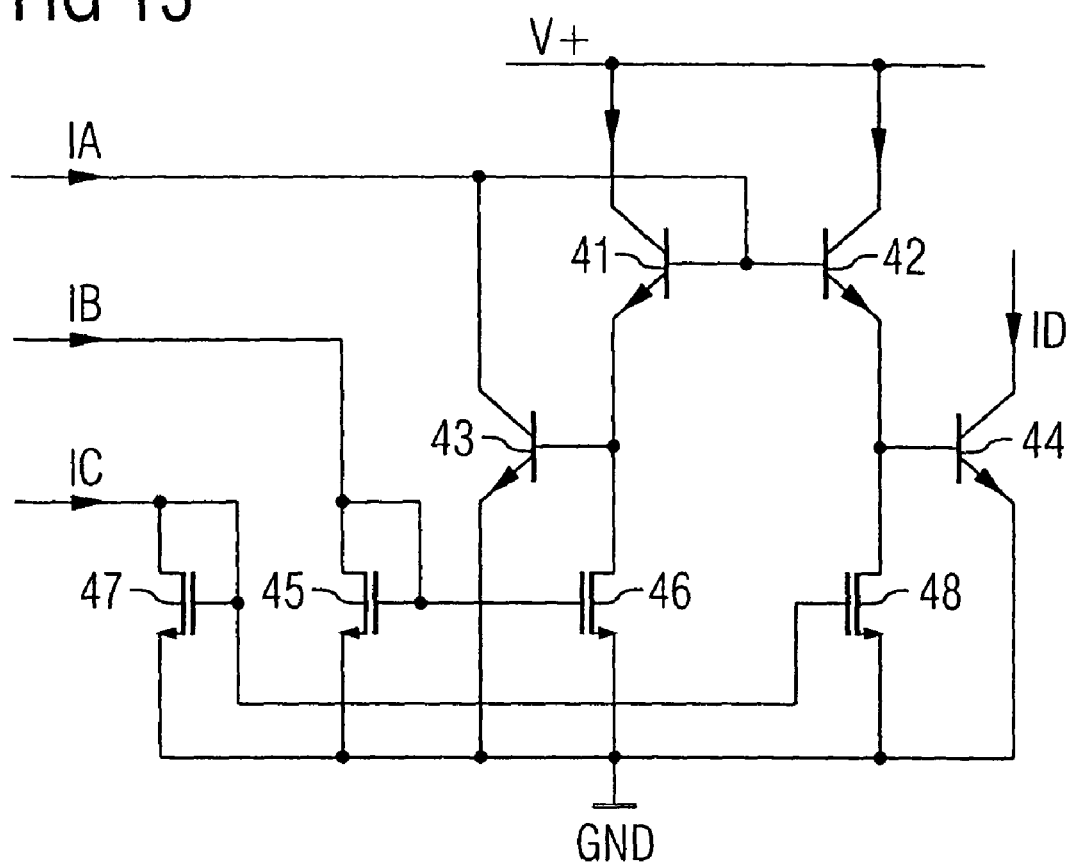
FIG. 15 shows an exemplary embodiment for a current multiplier circuit present in the current generating arrangements of FIGS. 10 and 11.

FIG. 15 shows an exemplary circuitry embodiment for the current multiplier 111, 121 according to FIG. 10. This current multiplier has four bipolar transistors 41, 42, 43, 44 and two current mirrors. A first current mirror, having an input transistor 45 connected as a diode and an output transistor 46, receives the second input current IB. This current mirror copies this input current IB onto the emitter current of a first bipolar transistor 41, whose base-emitter section is connected in series with the output transistor 46 of the first current mirror between the terminal for the internal power supply potential V+ and reference potential GND. A second current mirror with an input transistor 47 connected as a diode and an output transistor 48 receives the third input current IC. This second current mirror 47, 48 copies this third current IC onto the emitter current of a second bipolar transistor 42, whose base-emitter section is connected in series with the output transistor of the second current mirror 48 between the terminal for the internal power supply potential V+ and reference potential GND. A third bipolar transistor 43, whose base is connected to the emitter of the first bipolar transistor 41, has the first input current IA flowing through it. The collector terminal 42 of this third bipolar transistor 43 is coupled to the base of the first bipolar transistor 41, in order to make sure each time that the third bipolar transistor 43 is biased so much across the first bipolar transistor 41 that the collector current of the third bipolar transistor 43 can correspond to the first input current IA.

The circuit arrangement has a fourth bipolar transistor 44, whose base is connected to the emitter of the second bipolar transistor 42. This fourth bipolar transistor 44 in this circuit has a current ID automatically flowing through it, the value of which per equation 10 bears a relation to the first through third currents IA-IC. This current ID flowing through the fourth bipolar transistor 44 can be copied by a current mirror, not shown in greater detail, onto a current flowing against reference potential.

The invention claimed is:

1. A method for controlling a power MOS transistor having a control terminal and a load path, the load path connected in series with a load between voltage supply terminals, wherein a power supply voltage between the voltage supply terminals imposes a load voltage across the load and a load path voltage across the load path of the power MOS transistor, the method comprising:
   generating a control current for the control terminal during a switching process when the power MOS transistor changes switching states, the control current dependent on the power supply voltage and on at least one of the group consisting of the load path voltage and the load voltage, and
   generating the control current based at least temporarily on at least one of a group consisting of: a ratio of the load path voltage to the power supply voltage; and a ratio of the load voltage to the power supply voltage.

2. The method according to claim 1, wherein generating the control current further comprises generating a first control current and a second control current, each one dependent on at least one of a group consisting of: a ratio of the load path voltage to the power supply voltage; and a ratio of the load voltage to the power supply voltage.

3. The method according to claim 2, wherein one of the first and second control currents is constant and in which an other of the first and second control currents increases as the load path voltage decreases, at least for a predetermined interval.

4. The method according to claim 2 wherein one of the first and second control currents is constant and an other of the first and second control currents decreases as the load path voltage decreases, at least for a predetermined interval.

5. The method according to claim 2, wherein the first control current increases as the load path voltage decreases for a first interval, and the second control current decreases as the load path voltage decreases for a second interval.

6. The method according to claim 5, wherein the first control current is selected as the control current when the ratio of the load path voltage and the power supply voltage lies above a first threshold value.

7. The method according to claim 6, wherein the first threshold value is between 0.4 and 0.6.

8. The method according to claim 7, wherein the first interval constitutes a time in which the ratio of the load path voltage to the power supply voltage is between a second threshold value and the first threshold value.

9. The method according to claim 8, wherein the second interval constitutes a time in which the ratio of the load path voltage to the power supply voltage lies between the first threshold value and a third threshold value.

10. The method according to claim 8, wherein the second threshold value is substantially between 1.0 and 0.7.

11. The method according to claim 9, wherein the third threshold value is substantially between 0.3 and 0.

12. The method according to claim 2, wherein the first and second control currents are generated to have the same value for the first threshold value of the ratio of the load path voltage and the power supply voltage, and wherein a smaller of the first and second control currents is selected as the control current.

13. The method according to claim 2, wherein the first and second control currents each include a constant current component.

14. The method according to claim 8, wherein the first control current is generated in accordance with the following:

$$Ig1 = I01 \text{ for } Vds/Vs \geq b$$

$$Ig1 = I01 + Iref1 \cdot (1 - Vds/Vs - b \cdot Vds/Vs) \text{ for } Vds/Vs < b$$

where Ig1 denotes the first control current, I01 a constant first current component, Iref1 a constant first reference current, Vds the load path voltage, Vs the power supply voltage, and b the second threshold value.

15. The method according to claim 9, wherein the second control current is generated in accordance with the following:

$$Ig2 = I02 \text{ for } Vds/Vs < c$$

$$Ig2 = I02 + Iref2 \cdot (Vds/Vs - c) \text{ for } Vds/Vs \geq c$$

where Ig2 denotes the second control current, I02 a constant second current component, Iref2 a constant second reference current, Vds the load path voltage, Vs the power supply voltage, and c the third threshold value.

16. The method according to claim 14 wherein the first and second control currents are generated to have the same value for the first threshold value of the ratio of the load path voltage and the power supply voltage and when the power supply voltage is at a predetermined nominal value.

17. The method according to claim 1, further comprising generating the control current such that the control current is limited by a maximum value.

18. The method according to claim 1, further comprising generating the control current at least partly dependent on a gate-source voltage.

19. The method according to claim 18, further comprising:
using a constant current as the control current for gate-source voltages smaller than a first voltage and gate-source voltages higher than a second voltage, said first voltage being lower than a threshold voltage of the MOS transistor and said second voltage being higher than the threshold voltage of the MOS transistor.

20. An arrangement, comprising:
a power MOS transistor having a control terminal and a load path, the load path configured to be connected in series with a load between voltage supply terminals, wherein a power supply voltage between the voltage supply terminals is configured to impose a load voltage across the load and a load path voltage across the load path of the power MOS transistor, and
a driver circuit configured to generate a control current during a switching process when the power MOS transistor changes states, the control current generated in dependence on the power supply voltage and on at least one of the group consisting of the load path voltage and the load voltage,
wherein the driver circuit is configured such that the control current generated during the switching process is dependent at least temporarily on at least one a group consisting of: a ratio of the load path voltage to the power supply voltage; and a ratio of the load voltage to the power supply voltage.

21. The arrangement according to claim 20, wherein the driver circuit is configured to generate a first control current and a second control current, a selected one of which is provided as the control current.

* * * * *